United States Patent
Jo et al.

(10) Patent No.: US 12,408,517 B2
(45) Date of Patent: Sep. 2, 2025

(54) DISPLAY DEVICE

(71) Applicant: LG Display Co., Ltd., Seoul (KR)

(72) Inventors: Daegyu Jo, Seoul (KR); Miso Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 466 days.

(21) Appl. No.: 17/972,455

(22) Filed: Oct. 24, 2022

(65) Prior Publication Data

US 2023/0209927 A1    Jun. 29, 2023

(30) Foreign Application Priority Data

Dec. 28, 2021    (KR) .................. 10-2021-0189614

(51) Int. Cl.
*H10K 59/131*    (2023.01)
*H10K 59/123*    (2023.01)
*H10K 59/173*    (2023.01)

(52) U.S. Cl.
CPC ......... *H10K 59/123* (2023.02); *H10K 59/131* (2023.02); *H10K 59/173* (2023.02)

(58) Field of Classification Search
CPC .. H10K 59/123; H10K 59/131; H10K 59/173; H10K 59/179; H10K 59/352; H10K 59/122; H10K 59/124; H10K 59/353; H10K 59/80516; H10K 50/841; H10K 59/35; G06F 3/0412; H10H 29/142
See application file for complete search history.

(56) References Cited

U.S. PATENT DOCUMENTS

| | | | | |
|---|---|---|---|---|
| 10,453,909 B2 * | 10/2019 | Li | ........................ | H10K 59/38 |
| 11,183,548 B2 * | 11/2021 | Kwon | ................ | H10K 59/353 |
| 11,545,537 B2 * | 1/2023 | Lee | ..................... | H10K 59/131 |
| 11,574,984 B2 * | 2/2023 | Seo | ..................... | H10K 59/121 |

\* cited by examiner

*Primary Examiner* — Eduardo A Rodela
(74) *Attorney, Agent, or Firm* — Fenwick & West LLP

(57) ABSTRACT

A display device includes a substrate, a transistor disposed on the substrate and including a first source-drain electrode material pattern, an active layer, and a gate electrode positioned to overlap the active layer, a first planarization layer disposed on the first source-drain electrode material pattern of the transistor, a metal pattern disposed on the first planarization layer and electrically connected to the transistor, a second planarization layer covering the metal pattern and a bank disposed on the second planarization layer and including a plurality of openings of different sizes, wherein the metal pattern is spaced apart at the same interval in regions under the plurality of openings of different sizes. According to embodiments of the present specification, it is possible to provide a display device with improved color vision angle characteristics.

20 Claims, 18 Drawing Sheets

DISPLAY DEVICE

CROSS-REFERENCE TO RELATED APPLICATION

This application claims the benefit and priority from Republic of Korea Patent Application No. 10-2021-0189614, filed in the Republic of Korea on Dec. 28, 2021, which is hereby incorporated by reference in its entirety.

TECHNICAL FIELD

Embodiments of the present specification relate to a display device.

BACKGROUND

As the information society develops, demand for display devices for displaying images is increasing, and various types of display devices such as liquid crystal display devices and organic light emitting display devices are utilized.

A user using a display device may view an image displayed on the display device from the front of the display device, or may view a screen on which the image is displayed from various angles.

Accordingly, the display device is required to reduce a phenomenon in which color coordinates are distorted by the viewing angle so that the user may view the image from various angles.

SUMMARY

The present disclosure may provide a display device having improved luminance deviation (color viewing angle characteristic) according to a viewing angle.

According to aspects of the present disclosure, there is a display device including a substrate, a transistor disposed on the substrate and including a first source-drain electrode material pattern, an active layer, and a gate electrode positioned to overlap the active layer, a first planarization layer disposed on the first source-drain electrode material pattern of the transistor, a metal pattern disposed on the first planarization layer and electrically connected to the transistor, a second planarization layer covering the metal pattern and a bank disposed on the second planarization layer and including two or more openings of different sizes, wherein the metal pattern is spaced apart at the same interval in regions under the two or more openings of different sizes.

According to aspects of the present disclosure, there is a display device including: a substrate; a transistor disposed on the substrate and including a first source-drain electrode material pattern, an active layer, and a gate electrode positioned to overlap the active layer; a first planarization layer disposed on the first source-drain electrode material pattern of the transistor; a metal pattern disposed on the first planarization layer and electrically connected to the transistor; a second planarization layer covering the metal pattern; and a bank disposed on the second planarization layer and including two or more openings of different sizes, wherein the metal pattern is symmetrically disposed in regions under the two or more openings of different sizes.

According to embodiments of the present specification, it is possible to provide a display device with improved color vision angle characteristics.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
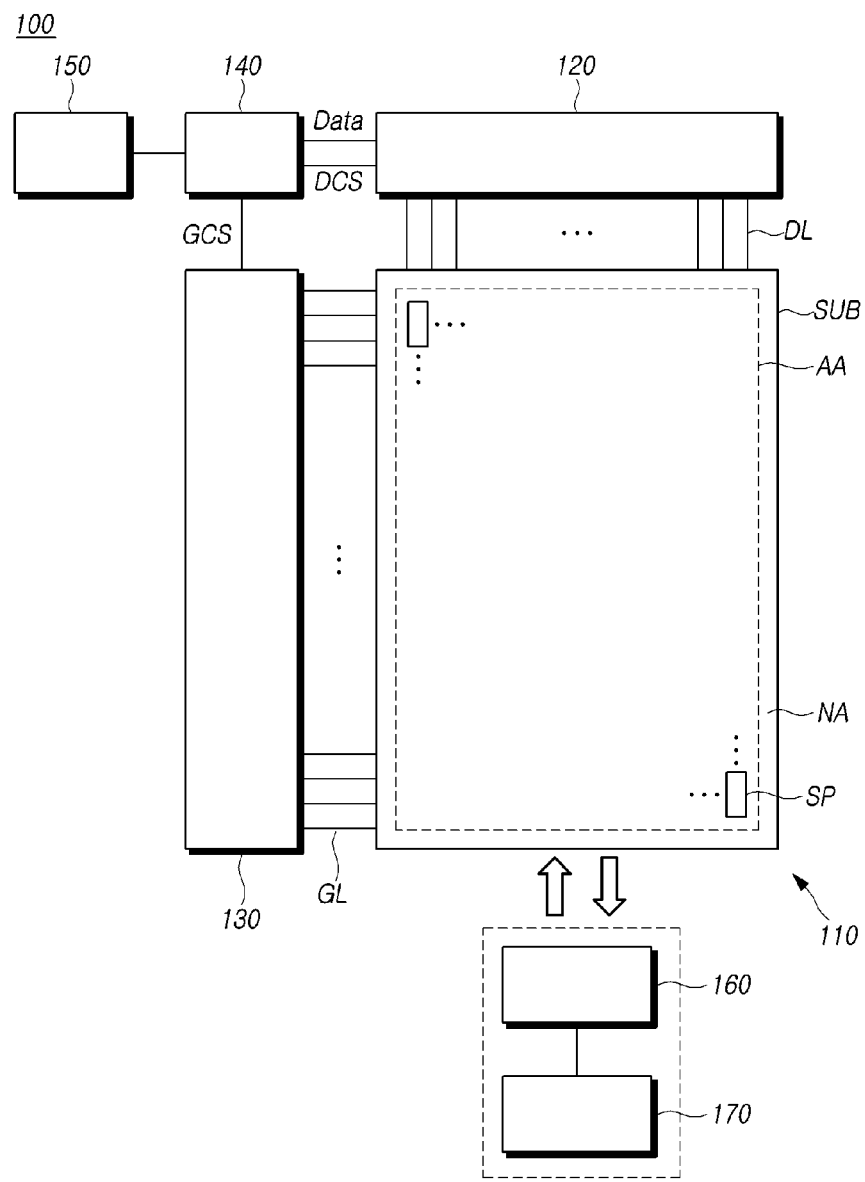
FIG. 1 is a system configuration diagram of a display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the accompanying drawings.

FIG. 1 is a system configuration diagram of a display device according to embodiments of the present specification.

Referring to FIG. 1, a display device 100 according to embodiments of the present specification may include a display panel 110 and a display driving circuit as components for displaying an image.

The display driving circuit is a circuit for driving the display panel 110 and may include a data driving circuit 120, a gate driving circuit 130, and a display controller 140.

The display panel 110 may include a display area AA in which an image is displayed and a non-display area NA in which an image is not displayed. The non-display area NA may be an outer area of the display area AA, and is also referred to as a bezel area. The whole or a part of the non-display area NA may be an area visible from the front surface of the display device 100, or may be an area bent and invisible from the front surface of the display device 100.

The display panel 110 may include a substrate SUB and a plurality of sub-pixels SP disposed on the substrate SUB. In addition, the display panel 110 may further include various types of signal lines to drive a plurality of sub-pixels SP.

The display device 100 according to the exemplary configurations of the present specification may be a liquid crystal display device or the like, or may be a light emitting display device in which the display panel 110 emits light by itself. When the display device 100 according to configurations of the present specification is a self-luminous display device, each of a plurality of sub-pixels SP may include a light emitting device.

For example, the display device 100 according to configurations of the present specification may be an organic light emitting display device in which a light emitting device is implemented as an organic light emitting diode (OLED). As another example, the display device 100 according to the exemplary configurations of the present specification may be an inorganic light emitting display device in which a light emitting device is implemented as an inorganic-based light emitting diode. As another example, the display device 100 according to embodiments of the present specification may be a quantum dot display device implemented as a quantum dot, which is a semiconductor crystal in which the light emitting device emits light by itself.

The structure of each of a plurality of sub-pixels SP may vary according to the type of the display device 100. For example, when the display device 100 is a self-luminous display device in which the sub-pixel SP emits light by itself, each sub-pixel SP may include a light emitting device that emits light by itself, one or more transistors, and one or more capacitors.

For example, various types of signal lines may include a plurality of data lines DL that transmit data signals (also referred to as data voltages or image signals) and a plurality of gate lines GL that transmit gate signals (also referred to as scan signals).

A plurality of data lines DL and a plurality of gate lines GL may cross each other. Each of a plurality of data lines DL may be disposed to extend in the first direction. Each of a plurality of gate lines GL may be disposed to extend in the second direction.

Here, the first direction may be a column direction, and the second direction may be a row direction. Alternatively, the first direction may be a row direction and the second direction may be a column direction.

The data driving circuit 120 is a circuit configured to drive a plurality of data lines DL, and may output data signals to the plurality of data lines DL. The gate driving circuit 130 is a circuit configured to drive a plurality of gate lines GL, and may output gate signals to the plurality of gate lines GL.

The display controller 140 may be a device configured to control the data driving circuit 120 and the gate driving circuit 130. The display controller 140 may control a driving timing for the plurality of data lines DL and a driving timing for the plurality of gate lines GL.

The display controller 140 may supply the data driving control signal DCS to the data driving circuit 120 in order to control the data driving circuit 120. The display controller 140 may supply a gate driving control signal GCS to the gate driving circuit 130 in order to control the gate driving circuit 130.

The display controller 140 may receive input image data from the host system 150 and supply the image data Data to the data driving circuit 120 based on the input image data.

The data driving circuit 120 may supply data signals to the plurality of data lines DL according to driving timing control of the display controller 140.

The data driving circuit 120 may receive digital image data from the display controller 140, convert the received image data into analog data signals, and output the converted data to the plurality of data lines DL.

The gate driving circuit 130 may supply gate signals to the plurality of gate lines GL according to timing control of the display controller 140. The gate driving circuit 130 may receive a first gate voltage corresponding to a turn-on level voltage and a second gate voltage corresponding to a turn-off level voltage together with various gate driving control signals GCS to generate gate signals, and supply the generated gate signals to the plurality of gate lines GL.

For example, the data driving circuit 120 is connected to the display panel 110 in a tape automated bonding (TAB) manner, or is connected to a bonding pad of the display panel 110 in a chip-on-glass method (COG) manner or a chip-on-panel method (COP) manner, or is connected to the display panel 110 in a chip-on-film method (COF) manner.

The gate driving circuit 130 is connected to the display panel 110 in a tape automated bonding (TAB) manner, or is connected to a bonding pad of the display panel 110 in a chip-on-glass method (COG) manner or a chip-on-panel method (COP) manner, or is connected to the display panel 110 in a chip-on-film method (COF) manner. Alternatively, the gate driving circuit 130 may be formed in the non-display area NA of the display panel 110 in a gate-in-panel (GIP) type. The gate driving circuit 130 may be disposed on the substrate SUB or connected to the substrate SUB. That is, when the gate driving circuit 130 is of the gate-in-panel (GIP) type, the gate driving circuit 130 may be disposed in the non-display area NA of the substrate SUB. The gate driving circuit 130 may be connected to the substrate in the case of a chip-on-glass (COG) type, a chip-on film (COF) type, or the like.

Meanwhile, at least one driving circuit of the data driving circuit 120 and the gate driving circuit 130 may be disposed in the display area AA of the display panel 110. For example, at least one driving circuit of the data driving circuit 120 and the gate driving circuit 130 may be disposed to be non-overlapping with the sub-pixels SP, or may be disposed to partially or entirely overlap the sub-pixels SP.

The data driving circuit 120 may be connected to one side (e.g., an upper side or a lower side) of the display panel 110. Depending on the driving method, the panel design method, etc., the data driving circuit 120 may be connected to opposite sides (e.g., upper and lower sides) of the display panel 110 or may be connected to two or more side surfaces of the four sides of the display panel 110.

The gate driving circuit 130 may be connected to one side (e.g., left or right side) of the display panel 110. Depending on the driving method, the panel design method, etc., the gate driving circuit 130 may be connected to opposite sides (e.g., left and right side) of the display panel 110, or may be connected to two or more side surfaces of the four sides of the display panel 110.

The display controller 140 may be implemented as a separate component from the data driving circuit 120, or may be integrated with the data driving circuit 120 to be implemented as an integrated circuit.

The display controller 140 may be a timing controller used in conventional display technology, a control device capable of further performing other control functions including the timing controller, a control device different from the timing controller, or a circuit in the control device. The display controller 140 may be implemented with various circuits or electronic components such as an integrated circuit (IC), a field programmable gate array (FPGA), an application specific integrated circuit (ASIC), or a processor.

The display controller 140 may be electrically connected to the data driving circuit 120 and the gate driving circuit 130 through a printed circuit board (PCB) or a flexible printed circuit board (FPCB).

The display controller 140 may transmit and receive signals to and from the data driving circuit 120 according to one or more predetermined interfaces. Here, for example, the interface may include a low voltage differential signaling (LVDS) interface, an EPI interface, or a serial personal interface (SPI).

The display device 100 according to configurations of this specification may include a touch sensor and a touch sensing circuit that senses the touch sensor to detect whether a touch has occurred by a touch object such as a finger or a pen or detects a touch position.

The touch sensing circuit may include a touch driving circuit 160 that drives and senses a touch sensor to generate and output touch sensing data, and a touch controller 170 that may detect occurrence of a touch or detect a touch position using the touch sensing data.

The touch sensor may include a plurality of touch electrodes. The touch sensor may further include a plurality of touch lines for electrically connecting the plurality of touch electrodes and the touch driving circuit 160.

The touch sensor may exist outside the display panel 110 in the form of a touch panel, or may exist inside the display panel 110.

When the touch sensor exists outside the display panel 110 in the form of a panel, the touch sensor is referred to as an external type (or an add-on type). When the touch sensor is the external type, the touch panel and the display panel 110 may be separately manufactured and coupled during an assembly process. The external touch panel may include a substrate for a touch panel and the plurality of touch electrodes on the substrate for the touch panel.

When the touch sensor is present inside the display panel 110, the touch sensor is referred to as an embedded type (or an in-cell type or a built-in type). When the touch sensor is the embedded type, the touch sensor may be formed on the substrate SUB together with signal lines and electrodes related to display driving during the manufacturing process of the display panel 110.

The touch driving circuit 160 may supply a touch driving signal to at least one of the plurality of touch electrodes, and may sense at least one of the plurality of touch electrodes to generate touch sensing data.

The touch sensing circuit may perform touch sensing using a self-capacitance sensing method or a mutual-capacitance sensing method.

When the touch sensing circuit performs touch sensing by the self-capacitance sensing method, the touch sensing circuit may perform touch sensing based on capacitance between each touch electrode and a touch object (e.g., a finger or a pen, etc.).

According to the self-capacitance sensing method, each of the plurality of touch electrodes may serve as a driving touch electrode or a sensing touch electrode. Touch driving circuit 160 may drive all or part of the plurality of touch electrodes and sense all or part of the plurality of touch electrodes.

When the touch sensing circuit performs touch sensing by a mutual-capacitance sensing method, the touch sensing circuit may perform touch sensing based on capacitance between touch electrodes.

According to the mutual-capacitance sensing method, multiple touch electrodes are divided into driving touch electrodes and sensing touch electrodes. The touch driving circuit 160 may drive the driving touch electrodes and sense the sensing touch electrodes.

The touch driving circuit 160 and the touch controller 170 included in the touch sensing circuit may be implemented as a separate device or may be implemented as one device. In addition, the touch driving circuit 160 and the data driving circuit 120 may be implemented as separate devices or may be implemented as one device.

The display device 100 may further include a display driving circuit and/or a power supply circuit that supplies various types of power to the touch sensing circuit.

The display device 100 according to embodiments of the present specification may be a mobile terminal such as a smartphone or a tablet, a monitor or a television (TV) of various sizes, and may be a display device of various types and sizes capable of displaying information or images.

Figure 2:
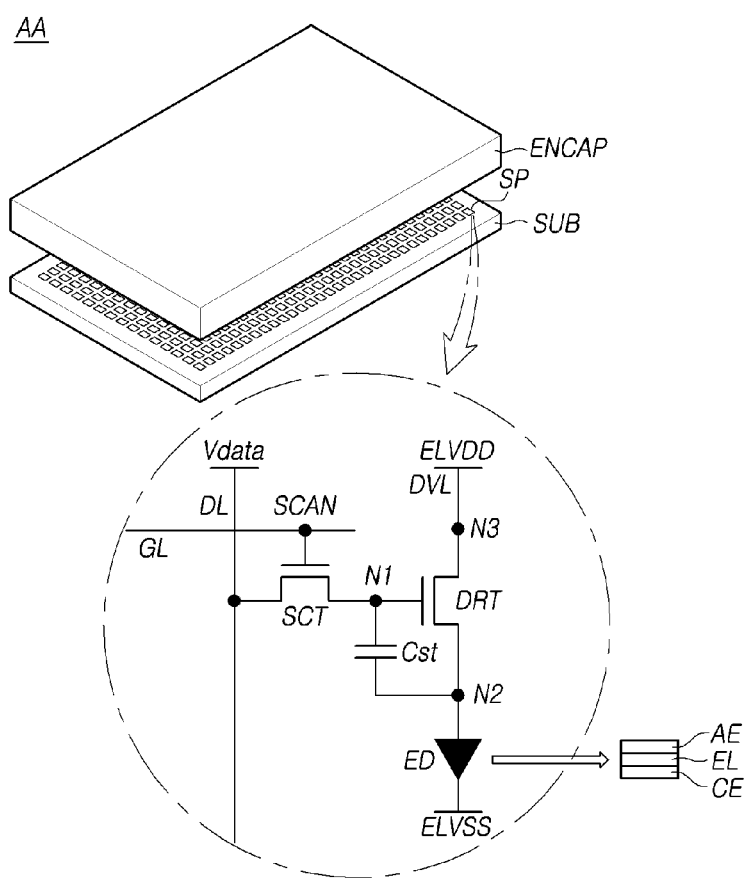
FIG. 2 is an equivalent circuit of a sub-pixel in a display panel according to embodiments of the present disclosure.

FIG. 2 is an equivalent circuit of a sub-pixel in a display panel according to embodiments of the present disclosure.

Referring to FIG. 2, each of the sub-pixels SP disposed in the display area AA of the display panel 110 (see FIG. 1) may include a light emitting device ED, a driving transistor DRT configured to drive the light emitting device ED, a scan transistor SCT configured to transfer data voltage Vdata to the first node N1 of the driving transistor DRT, and a storage capacitor Cst configured to maintain a constant voltage for one frame.

The driving transistor DRT may include a first node N1 to which the data voltage Vdata is applied, a second node N2 electrically connected to the light emitting device ED, and a third node N3 to which a high potential common voltage ELVDD is applied from the driving voltage line DVL. In the driving transistor DRT, the first node N1 may be a gate node, the second node N2 may be a source node or a drain node, and the third node N3 may be a drain node or a source node.

The light emitting device ED may include an anode electrode AE, a light emitting layer EL, and a cathode electrode CE. The anode electrode AE may be a pixel electrode disposed in each sub-pixel SP, and may be electrically connected to the second node N2 of the driving transistor DRT of each sub-pixel SP. The cathode electrode CE may be a common electrode commonly disposed in the plurality of sub-pixels SP, and a low potential common voltage ELVSS may be applied to the cathode electrode CE.

For example, the anode electrode AE may be a pixel electrode, and the cathode electrode CE may be a common electrode. Conversely, the anode electrode AE may be a common electrode, and the cathode electrode CE may be a pixel electrode. Hereinafter, for convenience of description, it is assumed that the anode electrode AE is a pixel electrode and the cathode electrode CE is a common electrode.

For example, the light emitting device ED may be an organic light emitting diode (OLED), an inorganic light emitting diode, or a quantum dot light emitting device. In this case, when the light emitting device ED is an organic light emitting diode, the light emitting layer EL in the light emitting device ED may include an organic light emitting layer including an organic material.

The scan transistor SCT is turned on and off by a scan signal SCAN, which is a gate signal applied through the gate line GL. The scan transistor SCT may be configured to switch an electrical connection between the first node N1 and the data line DL of the driving transistor DRT.

The storage capacitor Cst may be electrically connected between the first node N1 and the second node N2 of the driving transistor DRT.

As illustrated in FIG. 2, each sub-pixel SP may have a 2T (Transistor) 1C (Capacitor) structure including two transistors DRT and SCT and one capacitor Cst, and in some cases, may further include one or more transistors or may further include one or more capacitors.

The storage capacitor Cst may not be a parasitic capacitor (e.g., Cgs, Cgd) that may exist between the first node N1 and the second node N2 of the driving transistor DRT, but may be an external capacitor intentionally designed outside of the driving transistor DRT.

Each of the driving transistor DRT and the scan transistor SCT may be an n-type transistor or a p-type transistor.

Since the circuit elements (particularly, the light emitting device ED) in each sub-pixel SP are vulnerable to external moisture or oxygen, an encapsulation layer ENCAP may be disposed on the display panel 110 to prevent or at least reduce external moisture or oxygen from penetrating into the circuit elements (particularly the light emitting device ED). The encapsulation layer ENCAP may be disposed to cover the light emitting devices ED.

Figure 3:
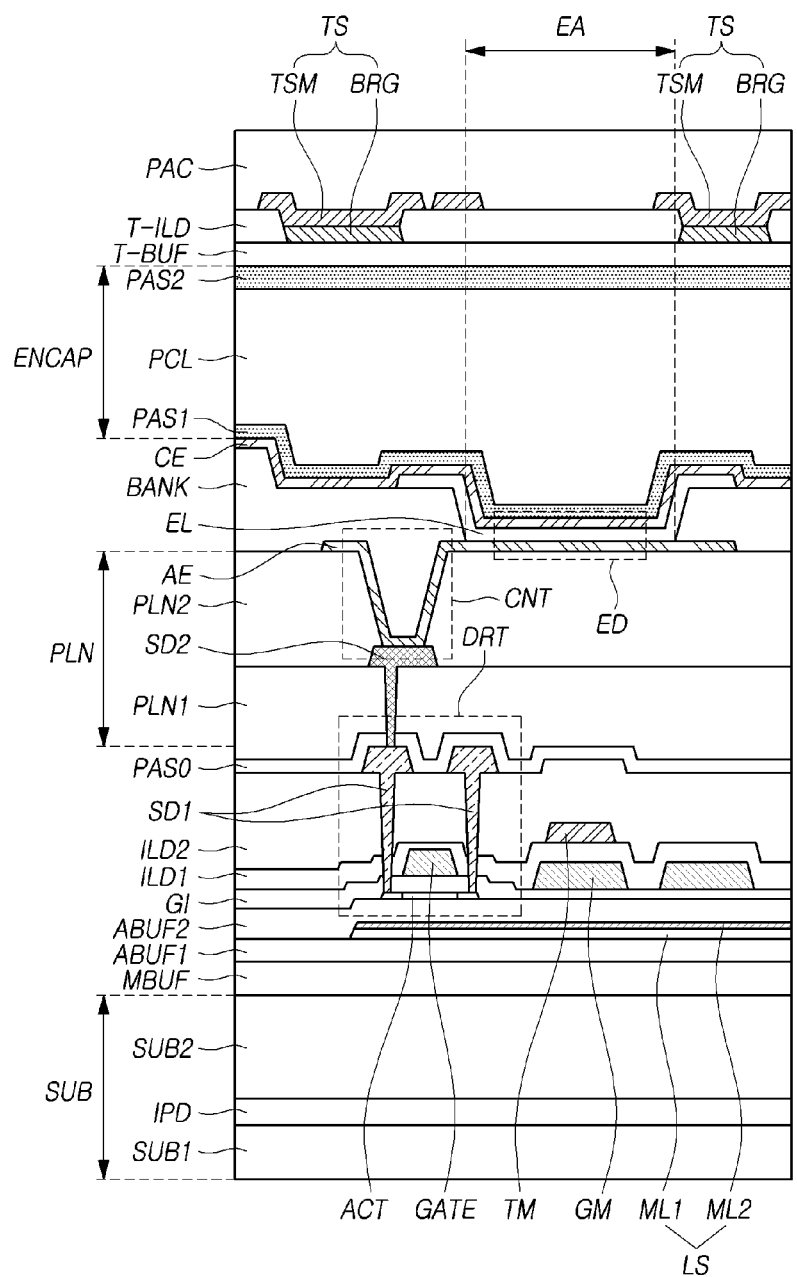
FIG. 3 is a cross-sectional view of a display area of a display panel according to embodiments of the present disclosure.

FIG. 3 is a cross-sectional view of a display area of a display panel according to embodiments of the present disclosure.

Referring to FIG. 3, the substrate SUB may include a first substrate SUB1, an interlayer insulating layer IPD, and a second substrate SUB2. The interlayer insulating layer IPD may be positioned between the first substrate SUB1 and the second substrate SUB2. Since the substrate SUB is composed of the first substrate SUB1, the interlayer insulating layer IPD, and the second substrate SUB2, moisture penetration may be prevented or at least reduced. For example, the first substrate SUB1 and the second substrate SUB2 may be polyimide (PI) substrates. The first substrate SUB1 may be referred to as a primary polyimide (PI) substrate, and the second substrate SUB2 may be referred to as a secondary polyimide (PI) substrate.

Referring to FIG. 3, various patterns (ACT, SD1, GATE), various insulating layers (MBUF, ABUF1, ABUF2, GI, ILD1, ILD2, PAS0), and various metal patterns (TM, GM, ML1, ML2) may be disposed on a substrate SUB.

Referring to FIG. 3, a multi-buffer layer MBUF may be disposed on the second substrate SUB2, and a first active buffer layer ABUF1 may be disposed on the multi-buffer layer MBUF.

A first metal layer ML1 and a second metal layer ML2 may be disposed on the first active buffer layer ABUF1. Here, the first metal layer ML1 and the second metal layer ML2 may be a light shield layer LS that shields light.

A second active buffer layer ABUF2 may be disposed on the first metal layer ML1 and the second metal layer ML2. An active layer ACT of the driving transistor DRT may be disposed on the second active buffer layer ABUF2.

A gate insulating layer GI may be disposed while covering the active layer ACT.

A gate electrode GATE of the driving transistor DRT may be disposed on the gate insulating layer GI.

The first interlayer insulating layer ILD1 may be disposed while covering the gate electrode GATE and the gate material layer GM. A metal pattern TM may be disposed on the first interlayer insulating layer ILD1. The metal pattern TM may be disposed differently from the formation position of the driving transistor DRT. The second interlayer insulating layer ILD2 may be disposed while covering the metal pattern TM on the first interlayer insulating layer ILD1.

Two first source-drain electrode material patterns SD1 may be disposed on the second interlayer insulating layer ILD2. One of the two first source-drain electrode material patterns SD1 is a source node of the driving transistor DRT, and the other is a drain node of the driving transistor DRT.

The two first source-drain electrode material patterns SD1 may be electrically connected to one side and the other side of the active layer ACT through a contact hole of the second interlayer insulating layer ILD2, the first interlayer insulating layer ILD1, and the gate insulating layer GI.

A portion of the active layer ACT overlapping the gate electrode GATE is a channel region. One of the two first source-drain electrode material patterns SD1 may be connected to one side of the channel region in the active layer ACT, and the other of the two first source-drain electrode material patterns SD1 may be connected to the other side of the channel region in the active layer ACT.

A passivation layer PAS0 is disposed while covering the two first source-drain electrode material patterns SD1. A planarization layer PLN may be disposed on the passivation layer PAS0. The planarization layer PLN may include a first planarization layer PLN1 and a second planarization layer PLN2.

The first planarization layer PLN1 may be disposed on the passivation layer PAS0.

A second source-drain electrode material pattern SD2 may be disposed on the first planarization layer PLN1. The second source-drain electrode material pattern SD2 may be connected to one of the two first source-drain electrode material patterns SD1 (corresponding to the second node N2 of the driving transistor DRT in the sub-pixel SP of FIG. 2) through the contact hole of the first planarization layer PLN1. The second source-drain electrode material pattern SD2 may be formed by the same material as the first source-drain electrode material pattern SD1, and may be a metal pattern.

The second planarization layer PLN2 may be disposed while covering the second source-drain electrode material pattern SD2. The light emitting device ED may be disposed on the second planarization layer PLN2.

Looking at the stacked structure of the light emitting device ED, an anode electrode AE may be disposed on the second planarization layer PLN2. The anode electrode AE may be electrically connected to the second source-drain electrode material pattern SD2 through a contact hole of the second planarization layer PLN2.

The bank BANK may be disposed while covering a portion of the anode electrode AE. A portion of the bank BANK corresponding to a light emitting area EA of the sub-pixel SP may be opened.

A part of the anode electrode AE may be exposed to the opening (open part) of the bank BANK. An emission layer EL may be located on the side surface of the bank BANK and the opening (open portion) of the bank BANK. All or a part of the emission layer EL may be positioned between adjacent banks BANK.

In the opening of the bank BANK, the emission layer EL may be in contact with the anode electrode AE. A cathode electrode CE may be disposed on the emission layer EL.

The light emitting device ED may be formed by the anode electrode AE, the light emitting layer EL, and the cathode electrode CE. The emission layer EL may include an organic layer.

An encapsulation layer ENCAP may be disposed on the above-described light emitting device ED.

The encapsulation layer ENCAP may have a single layer structure or a multilayer structure. For example, as illustrated in FIG. 3, the encapsulation layer ENCAP may include a first encapsulation layer PAS1, a second encapsulation layer PCL, and a third encapsulation layer PAS2.

For example, the first encapsulation layer PAS1 and the third encapsulation layer PAS2 may be inorganic layers, and the second encapsulation layer PCL may be organic layers. Among the first encapsulation layer PAS1, the second encapsulation layer PCL, and the third encapsulation layer PAS2, the second encapsulation layer PCL, which is an organic layer, is the thickest. The second encapsulation layer PCL may serve as a planarization layer.

The first encapsulation layer PAS1 may be disposed on the cathode electrode CE, and may be disposed closest to the light emitting device ED. The first encapsulation layer PAS1 may be formed of an inorganic insulating material capable of low-temperature deposition. The first encapsulation layer PAS1 may be formed of an inorganic insulating material capable of low-temperature deposition. For example, the first encapsulation layer PAS1 may be silicon nitride (SiNx), silicon oxide (SiOx), silicon oxynitride (SiON), or aluminum oxide (Al2O3). Since the first encapsulation layer PAS1 is deposited in a low temperature atmosphere, the first encapsulation layer PAS1 may prevent damage to the emission layer EL including an organic material vulnerable to the high temperature atmosphere during the deposition process.

The second encapsulation layer PCL may be formed to have a smaller area than the first encapsulation layer PAS1. In this case, the second encapsulation layer PCL may be formed to expose both ends of the first encapsulation layer PAS1 (not shown in FIG. 3). The second encapsulation layer PCL serves as a buffer for relieving stress between each layer due to bending of the display device 100, and may also serve to enhance planarization performance. For example, the second encapsulation layer PCL may be an acrylic resin, an epoxy resin, polyimide, polyethylene, or silicon oxycarbon (SiOC), and may be formed of an organic insulating material. For example, the second encapsulation layer PCL may be formed through an inkjet method.

The third encapsulation layer PAS2 may be formed to cover an upper surface and a side surface of each of the second encapsulation layer PCL and the first encapsulation layer PAS1 on the substrate SUB on which the second encapsulation layer PCL is formed. The third encapsulation layer PAS2 may reduce or block penetration of external moisture or oxygen into the first encapsulation layer PAS1 and the second encapsulation layer PCL. For example, the third encapsulation layer PAS2 is formed of an inorganic insulating material such as silicon nitride (SiNx), silicon oxide (SiOx), silicon oxynitride (SiON), or aluminum oxide (Al2O3).

Referring to FIG. 3, a touch sensor TS may be disposed on the encapsulation layer ENCAP. The structure of the touch sensor TS will be described in detail as follows.

A touch buffer layer T-BUF may be disposed on the encapsulation layer ENCAP. The touch sensor TS may be disposed on the touch buffer layer T-BUF.

The touch sensor TS may include a touch sensor metal TSM and a bridge metal BRG positioned on different layers.

A touch interlayer insulating layer T-ILD may be disposed between the touch sensor metal TSM and the bridge metal BRG.

For example, the touch sensor metals TSM may include a first touch sensor metal TSM, a second touch sensor metal TSM, and a third touch sensor metal TSM disposed adjacent to each other. There is a third touch sensor metal TSM between the first touch sensor metal TSM and the second touch sensor metal TSM, and the first touch sensor metal TSM and the second touch sensor metal TSM may be electrically connected to each other. When the first touch sensor metal TSM and the second touch sensor metal TSM are electrically connected to each other, the first touch sensor metal TSM and the second touch sensor metal TSM may be electrically connected to each other through bridge metals BRG on different layers. The bridge metal BRG may be insulated from the third touch sensor metal TSM by a touch interlayer insulating layer T-ILD.

When the touch sensor TS is formed on the display panel 110, a chemical liquid (e.g., a developer or an etchant) used in the process may flow into the display panel 110 or moisture may flow in from the outside. Since the touch sensor TS is disposed on the touch buffer layer T-BUF, it is possible to prevent a chemical liquid, moisture, or the like from penetrating into the light emitting layer EL including an organic material during a manufacturing process of the touch sensor TS. Accordingly, the touch buffer layer T-BUF may prevent damage to the emission layer EL vulnerable to chemical liquid or moisture.

The touch buffer layer (T-BUF) may be formed of an organic insulating material having a low dielectric constant of 1 to 3 at a low temperature below a predetermined temperature (e.g., 100° C.) in order to prevent damage to the light emitting layer EL including an organic material vulnerable to high temperature. For example, the touch buffer layer T-BUF may be formed of an acrylic or siloxane-based material. As the display device 100 is bent, the encapsulation layer ENCAP may be damaged, and the touch sensor metal positioned on the touch buffer layer T-BUF may be broken. Even when the display device 100 is bent, the touch buffer layer T-BUF having a planarization performance with an organic insulating material may prevent damage to the encapsulation layer ENCAP and/or breakage of the metals TSM and BRG constituting the touch sensor TS.

Meanwhile, referring to FIG. 3, the protective layer PAC may be disposed while covering the touch sensor TS. The protective layer PAC may be an organic insulating layer. The organic insulating layer may be, for example, a material such as the planarization layer PLN described above. The organic insulating film may be formed of a material different from that of the second encapsulation layer PCL. For example, the protective layer PAC may include a thermosetting resin.

Figure 4:
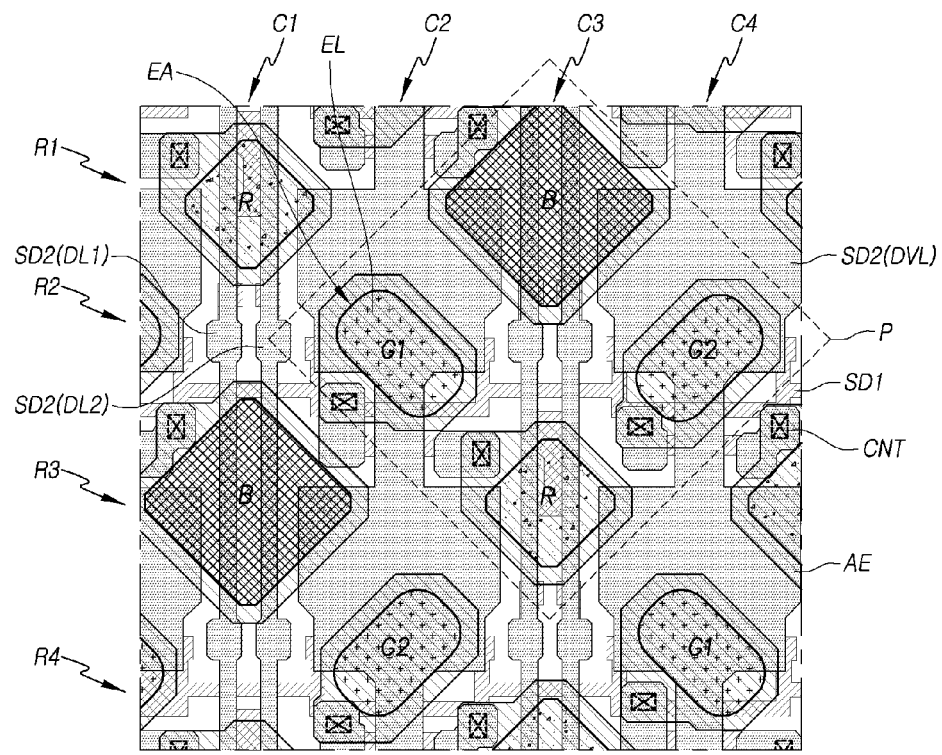
FIG. 4 is a view schematically illustrating a state in which a plurality of sub-pixels are disposed in a display area of a display panel according to embodiments of the present disclosure.

FIG. 4 is a view schematically illustrating a state in which a plurality of sub-pixels SP are disposed in a display area AA of a display panel 110 according to embodiments of the present disclosure.

In FIG. 4, among the above-described various layers, the first source-drain electrode material SD1, the second source-drain electrode material SD2, the anode electrode AE, and the light emitting layer EL positioned in the light emitting area EA are illustrated. The light emitting area EA may correspond to the above-described opening (open portion).

As shown in FIG. 4, one pixel P may include one blue light emitting area EA, one red light emitting area EA, and two green light emitting areas EA. Sub-pixels SP are disposed in the pixel P, and the pixel P may be formed in a diamond shape.

Accordingly, the red light emitting area EA and any one green light emitting area EA may be driven as one sub-pixel (also referred to as RG sub-pixel), and the blue light emitting area EA and the other green light emitting area EA may be driven as one sub-pixel (also referred to as BG sub-pixel). Accordingly, the pixel P includes a combination of an RG sub-pixel and a BG sub-pixel, and the structure of the pixel P is also referred to as an RG-BG pixel structure.

However, in the present specification, the description of the blue light emitting area is referred to as the blue sub-pixel B, the description of the red light emitting area is referred to as the red sub-pixel R, and the description of the green light emitting area is referred to as the green sub-pixel G.

That is, according to this, the RG sub-pixel is composed of a red sub-pixel R and a green sub-pixel G, and the BG sub-pixel is composed of a blue sub-pixel B and a green sub-pixel G.

Referring to FIG. 4, a plurality of data lines DL and a plurality of driving voltage lines DVL extend in a first direction and are disposed on a substrate. A plurality of data lines DL and a plurality of driving voltage lines DVL may comprise of the second source-drain electrode material SD2 described above.

The light emitting area EA of a plurality of sub-pixels SP may be disposed to overlap at least one data line DL and/or at least one driving voltage line DVL.

Referring to FIG. 4, the light emitting area EA of the first color sub-pixel SP may be positioned to overlap at least one data line DL. Although FIG. 4 illustrates that the first color sub-pixel SP is a red sub-pixel R or a blue sub-pixel B, the first color sub-pixel SP may be a green sub-pixel G1 and G2 or a sub-pixel SP representing other colors. For convenience of description, it is assumed that the first color sub-pixel SP is a blue sub-pixel B, but this invention is not limited thereto.

From the viewpoint of the data line DL, it may be seen that a plurality of data lines DL are disposed to penetrate an area under the light emitting area EA of at least one first color sub-pixel SP.

Referring to FIG. 4, the light emitting area EA of the second color sub-pixel SP may be disposed to overlap at least one driving voltage line DVL. The light emitting area EA of the second color sub-pixel SP may not be positioned to overlap the data line DL.

Although FIG. 4 illustrates that the second color sub-pixel SP is a green sub-pixel G1 and G2, the second color sub-pixel SP may be a red sub-pixel R, a blue sub-pixel B, or a sub-pixel representing other colors. For convenience of description, it is assumed that the second color sub-pixels SP are green sub-pixels G1 and G2, but this invention is not limited thereto.

The light emitting area EA of the second color sub-pixel SP may be positioned in a direction inclined compared to the first direction.

Specifically, the light emitting area EA of the second color sub-pixel SP may be inclined at a predetermined angle from a first direction in which a plurality of data lines DL and a plurality of driving voltage lines DVL extend.

The second color sub-pixel SP and the first color sub-pixel SP may be disposed in different rows. In addition, the second color sub-pixel SP and the first color sub-pixel SP may be arranged in different columns.

Referring to FIG. 4, the green sub-pixel G may be disposed in an even row (R2, R4, etc.), while the blue sub-pixel B may be disposed in an odd row (R1, R3, etc.). In addition, the green sub-pixels G1 and G2 may be disposed in the even columns C2 and C4, while the blue sub-pixel B may be disposed in the odd columns C1, C3, or the like.

Further, referring to FIG. 4, the red sub-pixel R may be disposed in odd rows (R1, R3, or the like) and odd columns C1 and C3.

Accordingly, blue sub-pixels B and red sub-pixels R are alternately arranged in odd rows (R1, R3, etc.) and odd columns (C1, C3, etc.). In this case, the area of the light emitting area EA of the blue sub-pixel B and the area of the light emitting area EA of the red sub-pixel R may be different from each other. For example, the area of the light emitting area EA of the blue sub-pixel B may be larger than the area of the light emitting area EA of the red sub-pixel R. Accordingly, the distance between the blue sub-pixels B may be smaller than the distance between the red sub-pixels R.

Since the distance between the blue sub-pixels B and the distance between the red sub-pixels R may be different from each other, the shape of the light emitting area EA of the green sub-pixels G1 and G2 disposed therebetween may be different from the rhombus shape.

For example, the shape of the light emitting areas EA of the green sub-pixels G1 and G2 may be elongated in the direction of the red sub-pixel R so that the area of the light emitting regions EA of the green sub-pixels G1 and G2 may be as large as possible.

Accordingly, the green sub-pixels G1 and G2 may include a first green sub-pixel G1 elongated in the left upper and right lower sides and a second green sub-pixel G2 elongated in the right upper and left lower sides.

Meanwhile, referring to FIG. 4, a plurality of data lines DL may be arranged in a pair of two or more data lines DL.

For example, referring to FIG. 4, the first data line DL1 and the second data line DL2 may be arranged adjacent to each other in a pair. The first data line DL1 and the second data line DL2 form a pair and are disposed in an area between two different driving voltage lines DVL.

The first data line DL1 may supply a data voltage for image display to the first color sub-pixel SP. The second data line DL2 may supply a data voltage for image display to the second color sub-pixel SP.

For example, the first data line DL1 may supply a data voltage for image display to sub-pixels SP located in odd columns (e.g., C1, C3, etc.). Accordingly, the first data line DL1 may supply a data voltage for image display to the red sub-pixels R and the blue sub-pixels B located in the odd-numbered columns (e.g., C1, C3, etc.).

In addition, the second data line DL2 may supply a data voltage for image display to sub-pixels SP located in even columns (e.g., C2, C4, etc.). Accordingly, the second data line DL2 may supply a data voltage for image display to the green sub-pixels G1 and G2 located in the even column (e.g., C2, C4, etc.).

Conversely, the first data line DL1 may supply data voltages for image display to sub-pixels SP located in even columns (e.g., C2, C4, etc.), and the second data line DL2 may supply data voltages for image display to sub-pixels SP located in odd columns (e.g., C1, C3, etc.).

Hereinafter, it is assumed that the first data line DL1 supplies data voltages for image display to sub-pixels SP located in odd columns (e.g., C1, C3, etc.), and the second data line DL2 supplies data voltages for image display to sub-pixels SP located in even columns (e.g., C2, C4, etc.), but the present invention is not limited thereto.

Accordingly, the first data line DL1 may supply a data voltage to the red sub-pixel R and the blue sub-pixel B, and the second data line DL2 may supply a data voltage to the green sub-pixel G1 and G2.

Referring to FIG. 4, the light emitting area EA of the red sub-pixel R and the light emitting area EA of the blue sub-pixel B are located on the first data line DL1 and the second data line DL2. According to a design method of the driving voltage line DVL, the light emitting area EA of the red sub-pixel R and the light emitting area EA of the blue sub-pixel B may be disposed to overlap the driving voltage line DVL. The light emitting areas EA of the green sub-pixels G1 and G2 are located on the driving voltage line DVL.

On the other hand, as illustrated above in FIG. 3, in order to increase the aperture ratio while increasing the resolution by disposing many sub-pixels SP in a narrow region, the display device according to embodiments of this specification may include both the first source-drain electrode pattern SD1 and the second source-drain electrode patterns SD2.

Referring to FIG. 3 described above, the first source-drain electrode material pattern SD1 is covered by the first planarization layer PLN1, and the second source-drain electrode material pattern SD2 is covered by the second planarization layer PLN2.

In addition, in the display device according to embodiments of the present specification, a plurality of data lines DL may be formed using a second source-drain electrode material pattern SD2. In addition, a plurality of driving voltage lines DVL may be formed using the second source-drain electrode material pattern SD2.

According to this, a plurality of data lines DL and a plurality of driving voltage lines DVLs affect the flatness of the opening formed by removing at least a part of the bank BANK.

Referring to FIG. 4, the red sub-pixel R and the blue sub-pixel B penetrate data lines DL having a narrow area, while the green sub-pixels G1 and G2 are positioned to overlap the driving voltage line DVL having a large area.

Accordingly, the red sub-pixel R, the blue sub-pixel B, and the green sub-pixels G1 and G2 may each have different patterns of steps. Accordingly, the luminance varies for each color according to the viewing angle of the display area. Accordingly, there is a problem in that color coordinates are distorted according to the viewing angle.

In addition, the first source-drain electrode material pattern SD1 is also disposed to overlap the light emitting area EA, and the first source-drain electrode material pattern SD1 also affects the flatness of the opening. That is, the above-described color coordinates may also be distorted by the first source-drain electrode material pattern SD1.

Therefore, there is a need for a method capable of solving a problem in which color coordinates are distorted by the first source-drain electrode material pattern SD1 and the second source-drain electrode material pattern SD2.

Figure 5:
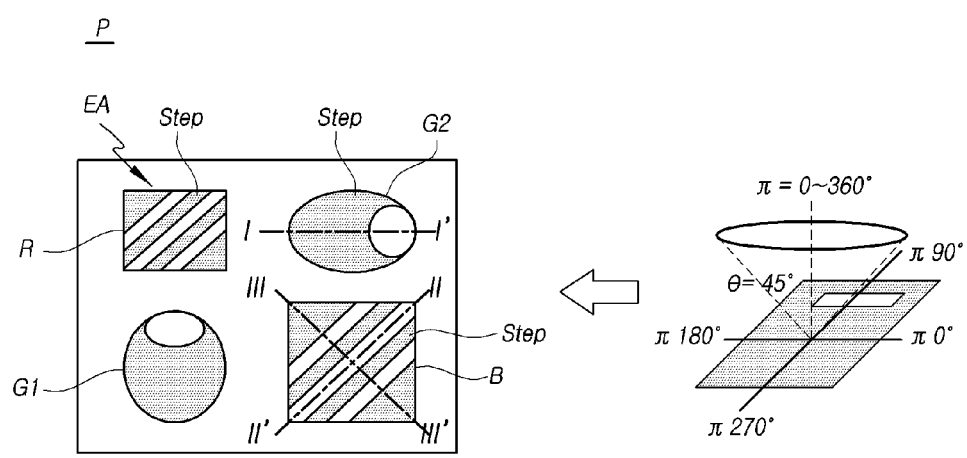
FIG. 5 is a diagram conceptually illustrating a state in which a step occurs in a light emitting region due to a second source-drain electrode material pattern in a sub-pixel according to embodiments of the present disclosure.

FIG. 5 is a diagram conceptually illustrating a state in which a step occurs in a light emitting region EA due to a second source-drain electrode material pattern SD2 in a sub-pixel SP.

Referring to FIG. 5, in one embodiment a region corresponding to the step being higher than the peripheral region due to the second source-drain electrode material pattern SD2 in the light emitting area EA.

Referring to FIGS. 4 and 5 together, in the case of the red sub-pixel R and the blue sub-pixel B, a step may be formed by the data line DL. In the case of the green sub-pixels G1 and G2, a step may be formed by the driving voltage line DVL.

The data line DL may be formed to have a relatively thin width. Accordingly, a step of a pattern crossing the light emitting area EA is formed in the blue sub-pixel B and the red sub-pixel R. On the other hand, the driving voltage line DVL may overlap the green sub-pixels G1 and G2 in a relatively large area. Accordingly, a step may be formed in the remaining wide area except for a part of the light emitting areas EA of the green sub-pixels G1 and G2.

Meanwhile, in FIG. 5, a spherical coordinate system is schematically illustrated in order to interpret the cause of luminance deviation according to the viewing angle due to the step.

The spherical coordinate system defines a position of a point using $(r, \pi, \theta)$.

r is the distance from the origin (0, 0, 0) to any one point. $\pi$ is the angle between the z-axis and the x-axis of a point in the positive direction. $\theta$ is the angle between a point and the z-axis in the positive direction.

Referring to FIG. 5, the cross-section I-I' of the green sub-pixel G2 may be a cross-section cut along a straight line connecting $\pi=180°$ and $\pi=0°$. The II-II' section of the blue sub-pixel B may be a cross section cut along a straight line connecting $\pi=245°$ and $\pi=45°$. The III-III' cross-section of the blue sub-pixel B may be a cross-section cut along a straight line connecting $\pi=135°$ and $\pi=315°$. That is, I-I', II-II', and III-III' correspond to straight lines connecting $\pi=\alpha$ and $\pi=\alpha+180°$, respectively.

On the other hand, as a method for confirming the luminance deviation according to the viewing angle, a reference origin is set, and the distance from the origin is maintained and measured. According to this, r corresponds to a fixed constant value. In addition, since the change in luminance is measured on the entire surface of the display area, color viewing angle characteristics are measured in the range of $0°<\theta<90°$. Accordingly, $\theta$ corresponds to a viewing angle looking at the display area.

The color viewing angle characteristic can be defined as a deviation value between the luminance measured at π=α and the luminance measured at π=α+180° with θ set in advance. That is, it can be said that the color viewing angle characteristic (luminance deviation according to the viewing angle) is better as the value is smaller, and worse as the value increases.

Hereinafter, with reference to the green sub-pixel G2 and the blue sub-pixel B of FIG. 5, the luminance deviation according to the difference in the viewing angle θ will be described.

Figure 6A:
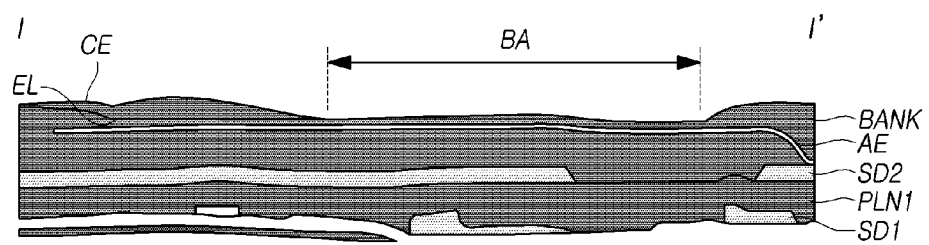
FIGS. 6A to 6C are cross-sectional views and color vision angle characteristics of the green and blue sub-pixels of FIG. 5 according to embodiments of the present disclosure.
Figure 6A:
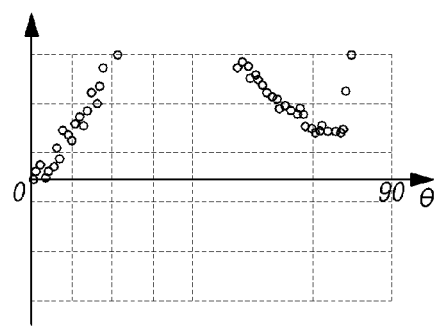
Figure 6B:
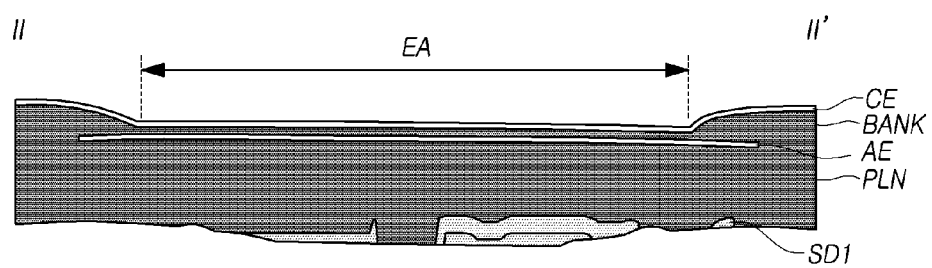
Figure 6B:
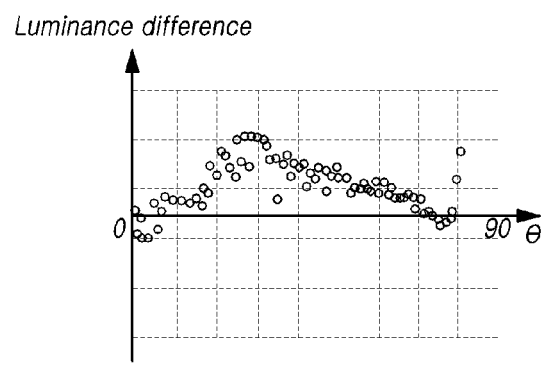
Figure 6C:
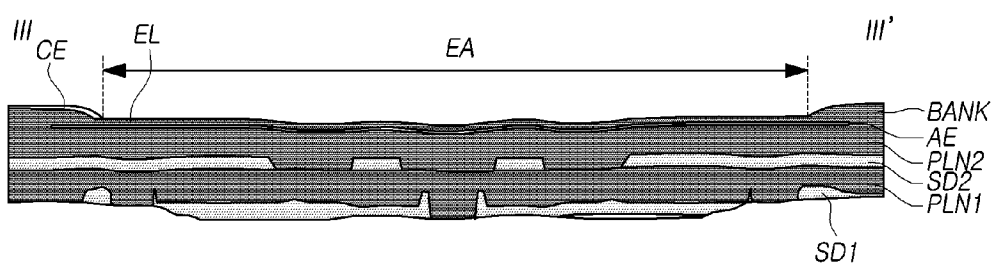
Figure 6C:
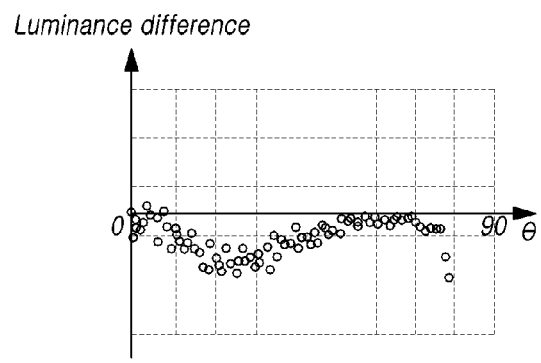

FIGS. 6A to 6C are cross-sectional views and color vision angle characteristics of the green sub-pixel G2 and blue sub-pixel B of FIG. 5 according to embodiments of the present disclosure.

FIG. 6A is a cross-sectional view taken along line I-I' of the green sub-pixel G2 of FIG. 5 and a view for explaining color viewing angle characteristics along line I-I'.

Referring to the upper figure of FIG. 6A, the second source-drain electrode material pattern SD2 is asymmetrically disposed in an area overlapping the light emitting area EA. The second source-drain electrode material pattern SD2 is located in the π=180° region in the area under the light emitting area EA, but not located in the π=0° region.

Referring to the lower figure of FIG. 6A, when θ=0°, the color viewing angle characteristic (difference in luminance) is defined as 0, and the color viewing angle characteristic according to the θ value is indicated. In FIG. 6A, the range of θ is expressed from 0° to 90°, and the dotted line on the vertical axis is indicated in units of 10°. This is also the same in FIGS. 6B and 6C. Referring to this, as θ increases from 0°, it can be seen that the color viewing angle characteristic sharply increases, and the deviation value of luminance is greatest in the range of θ=20° to 50°.

In particular, in the case of a mobile terminal used in an environment where the user looks at the screen from various angles and is used in various illuminance environments, poor color viewing angle characteristics in the range of θ=20° to 50° may reduce the perceived quality of the screen. Accordingly, in the case of the green sub-pixel G2, it can be seen that the color viewing angle characteristic is not good.

This characteristic is also the same in the green sub-pixel G1 disposed at a different angle from the green sub-pixel G2.

FIG. 6B is a cross-sectional view taken along II-II' of the blue sub-pixel B of FIG. 5 and a diagram illustrating color viewing angle characteristics along line II-II'.

Referring to the upper figure of FIG. 6B, in the cross-sectional view of the blue sub-pixel B taken along II-II', the second source-drain electrode material pattern SD2 is not located.

That is, according to this, a step due to the second source-drain electrode material pattern SD2 does not appear in a cross-sectional view of the blue sub-pixel B taken along the line II-II'.

Meanwhile, at the bottom of FIG. 6B, a graph is shown in which the color viewing angle characteristic is defined as 0 when θ=0°, and the color viewing angle characteristic according to the θ value is shown from θ=0° to θ=90°.

Referring to this, the case in which the second source-drain electrode material pattern SD2 is not provided has superior color viewing angle characteristics compared to the case in which the second source-drain electrode material pattern SD2 is asymmetrically disposed. However, even in the absence of the second source-drain electrode material pattern SD2, it can be seen that the color viewing angle deviation gradually increases as the θ value increases from 0°.

On the other hand, the reason why the color viewing angle characteristic is somewhat deteriorated even in the absence of the second source-drain electrode material pattern SD2 is that the planarization function of the planarization layer (PLN; collectively referred to as PLN1 and PLN2) positioned on the first source-drain electrode material pattern SD1 is somewhat limited. Accordingly, a step by the first source-drain electrode material pattern SD1 may cause a step in the bottom surface of the opening in the light emitting area EA.

That is, the color viewing angle characteristic may be affected by the first source-drain electrode material pattern SD1.

In particular, as the pixel structure becomes more complex, the first source-drain electrode material pattern SD1 may be disposed on the substrate in various patterns. When the first source-drain electrode material pattern SD1 and the light emitting area EA are designed so that they do not overlap, the area of the light emitting area EA may be reduced, and thus an aperture ratio may be lowered. Alternatively, there is a problem in that design difficulty greatly increases in configuring the circuit portion of the sub-pixel.

Therefore, even if the first source-drain electrode material pattern SD1 and the light emitting area EA overlap, it is required that the effect of the step is minimized due to the disposition of the first source-drain electrode material pattern SD1 and the opening in the light emitting area EA.

FIG. 6C is a cross-sectional view taken along of the blue sub-pixel B of FIG. 5 and a view for explaining color viewing angle characteristics along the line III-III'.

Referring to the upper figure of FIG. 6C, the second source-drain electrode material pattern SD2 is symmetrically disposed along line III-III'.

The lower graph of FIG. 6C shows the color viewing angle characteristics up to θ=90° by defining the color viewing angle characteristic when θ=0° along the line of the blue sub-pixel B as 0.

According to the graph, when θ gradually increases from θ=0°, the color viewing angle characteristic has a negative value. That is, as the θ value increases from 0°, it can be seen that the color viewing angle deviation is more improved compared to the case where θ=0°.

This result is also the same in the red sub-pixel R disposed to overlap the data lines.

Comparing FIGS. 6C and 6B, even if the first source-drain electrode material pattern SD1 overlaps the light emitting area EA, when the second source-drain electrode material pattern SD2 is symmetrically disposed, a step due to the arrangement of the first source-drain electrode pattern SD1 disposed under the opening may be compensated.

In addition, comparing FIGS. 6C and 6A, even if the second source-drain electrode material pattern SD2 is disposed in the opening EA, the color vision angle characteristic is further improved when the second source-drain electrode material pattern SD2 is symmetrically disposed in the light emitting area EA.

In other words, when the second source-drain electrode material pattern SD2 is disposed in a manner crossing through the central region of the light emitting area EA rather than being completely absent in the light emitting area EA or only in the edge region, the color vision characteristics may be better. In addition, when at least a part of the second source-drain electrode material pattern SD2 is disposed inside the light emitting area EA to be overlapped with respect to a symmetry axis, color vision characteristics may be improved.

Figure 7:
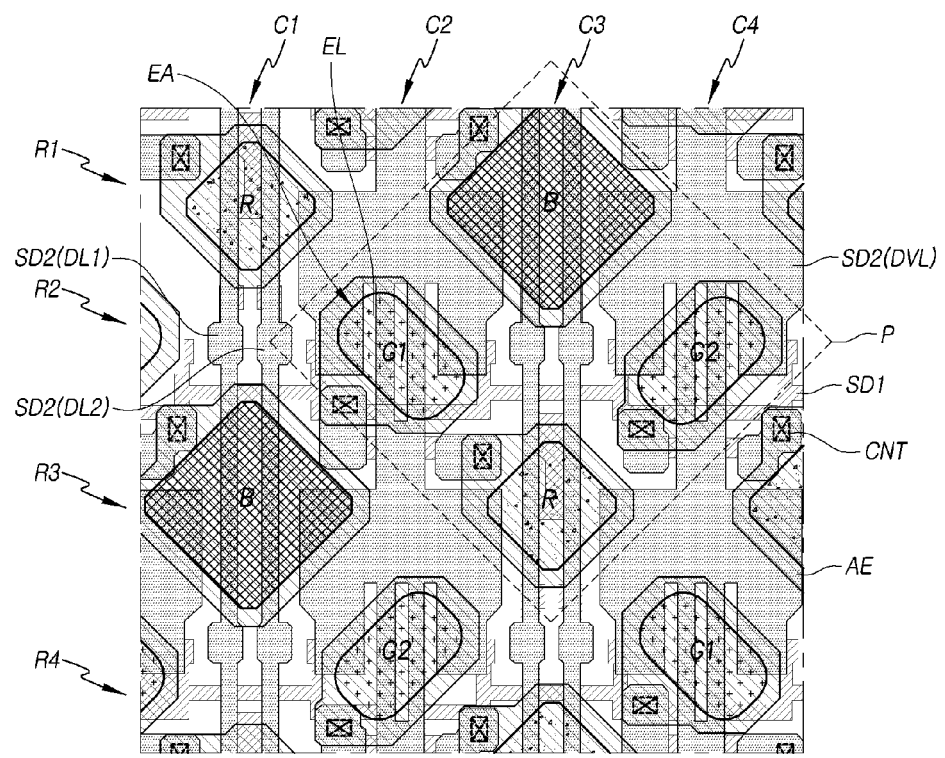
FIG. 7 is a diagram illustrating that a second source-drain electrode material pattern is disposed on a substrate with symmetry in a region overlapping a light emitting region of a sub-pixel in a display device according to embodiments of the present disclosure.

FIG. 7 is a diagram illustrating that a second source-drain electrode material pattern SD2 is disposed on a substrate with symmetry in a region overlapping a light emitting area EA of a sub-pixel SP in a display device according to embodiments of the present disclosure.

Referring to FIG. 7, the light emitting area EA of the blue sub-pixel B is positioned to overlap a pair of data lines DL extending in a first direction. Specifically, the light emitting area EA of the blue sub-pixel B overlaps the first data line DL1 and the second data line DL2, and in the area below the light emitting area EA, the first data line DL1 and the second data line DL2 are symmetrically arranged based on a virtual symmetrical axis extending in the first direction.

These pair of data lines DL1 and DL2 are disposed to penetrate a lower region of the light emitting area EA of the blue sub-pixel B.

Furthermore, referring to FIG. 7, the light emitting area EA of the first color sub-pixel (e.g., blue sub-pixel B) positioned to overlap the pair of data lines DL1 and DL2 may overlap the driving voltage line DVL. Here, driving voltage lines DVL may be symmetrically disposed on both sides of the light emitting area EA based on the virtual symmetry axis.

For example, referring to FIG. 7, the light emitting area EA and the driving voltage line DVL of the blue sub-pixel B may overlap in some areas. The partial region overlapping the driving voltage line DVL in the light emitting area EA of the blue sub-pixel B is symmetrically arranged with respect to the virtual symmetry axis.

Accordingly, the second source-drain electrode material pattern SD2 may be disposed to overlap the light emitting area EA in a large area.

Since the second source-drain electrode material pattern SD2 is located closer to the opening (open part) than the first source-drain electrode material pattern SD1, it may have a greater influence on color viewing angle characteristics than the first source-drain electrode material pattern SD1. By disposing the second source-drain electrode material pattern SD2 to overlap the light emitting area EA in a large part using the driving voltage line DVL, the first source-drain electrode material pattern SD1 may be freely disposed in the area overlapping the light emitting area EA. Accordingly, it is possible to increase the aperture ratio while reducing the size of each of the sub-pixels.

Meanwhile, the light emitting regions EA of the green sub-pixels G1 and G2 are disposed to overlap the driving voltage line DVL extending in the first direction.

A pair of second source-drain electrode material patterns SD2 extending in the first direction are disposed in a region below the light emitting area EA of the green sub-pixels G1 and G2 to transmit the high potential driving voltage ELVDD. In addition, at least a part of these pair of second source-drain electrode material patterns SD2 can be overlapped with each other with respect to a virtual symmetry axis extending in the first direction. In addition, the pair of second source-drain electrode material patterns SD2 penetrate a region below the light emitting areas EA of the green sub-pixels G1 and G2 and may be connected to each other in a region that does not overlap the light emitting region EA.

The pair of second source-drain electrode material patterns SD2 located in a region below the light emitting areas EA of the green sub-pixels G1 and G2 may be spaced apart from each other. An interval between the second source drain electrode material patterns SD2 under the light emitting areas EA of the green sub-pixels G1 and G2 may be the same to an interval between the pair of data lines DL1 and DL2 positioned under the light emitting area EA of the blue sub-pixel B.

In addition, a width of each of the pair of second source-drain electrode material patterns SD2 located in a region below the light emitting area EA of the green sub-pixels G1 and G2 may be the same to a width of each of the pair of data lines DL1 and DL2 located under the light emitting area EA of the blue sub-pixel B.

Accordingly, in the blue sub-pixel B, the green sub-pixel G, and the red sub-pixel R, the second source-drain electrode material pattern SD2 positioned under the light emitting area EA may be symmetrically disposed. Accordingly, the color vision angle characteristics of the second color sub-pixels (e.g., green sub-pixels G1 and G2) positioned overlapping the driving voltage line DVL may be improved to a degree similar to the color vision characteristics of the first color sub-pixel (e.g., blue sub-pixel B) positioned overlapping the data lines.

Accordingly, even if the viewing angle (corresponding to θ in FIG. 5) of the display area is changed, the luminance deviation among the sub-pixels may be maintained at a constant level, and thus the problem of color coordinates being distorted may be greatly improved.

Meanwhile, referring to FIG. 7, a contact hole CNT in which the anode electrode AE of the light emitting device and the second source-drain electrode pattern SD2 are connected may be preferably positioned in a region that does not overlap the light emitting area EA.

Referring to FIGS. 3 and 7, at least a part of the second planarization layer PLN2 is removed from a region in which the contact hole CNT is positioned. Accordingly, a problem may occur in that the bottom surface of the opening (open portion) is sunk by the contact hole CNT. According to this, the color vision characteristic may deteriorate. Accordingly, it may be more desirable in terms of improving color vision angle characteristics that the contact hole CNT is located in an area that does not overlap the light emitting area EA.

FIGS. 8 to 11 are diagrams illustrating in more detail a second source-drain electrode material pattern SD2 positioned to overlap a light emitting area of a sub-pixel according to embodiments of the present disclosure.

Referring to FIGS. 8 to 11, the second source-drain electrode material pattern SD2 includes an inner pattern IP positioned to overlap the light emitting area EA.

Here, the inner pattern IP includes any one of the data line DL and the driving voltage line DVL among the second source-drain electrode material patterns SD2 overlapping the light emitting area EA.

Figure 8:
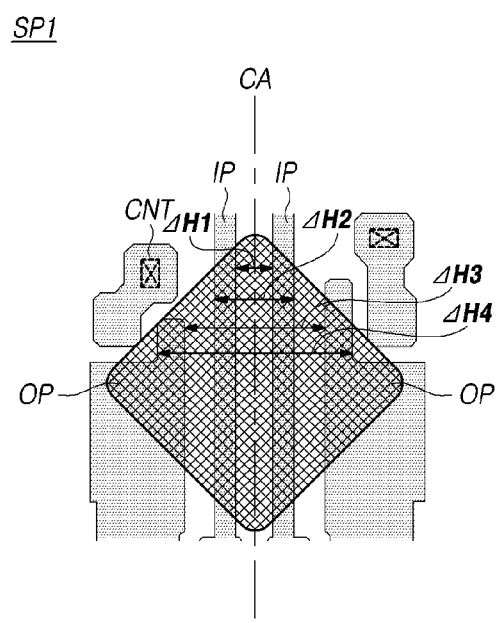
FIGS. 8 to 11 are diagrams illustrating in more detail a second source-drain electrode material pattern positioned to overlap a light emitting area of a sub-pixel according to embodiments of the present disclosure.
Figure 9:
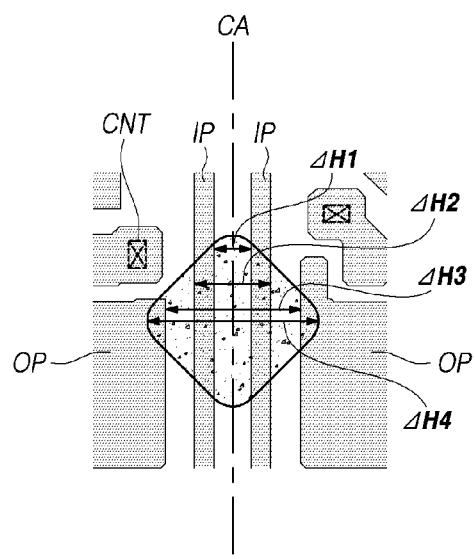

Referring to FIGS. 8 and 9, when the light emitting area EA of the first sub-pixel SP1 and the second sub-pixel SP2 is positioned to overlap the pair of data lines DL1 and DL2, the inner pattern IP may constitute a data line. That is, a data voltage for image display or the like may be applied to the inner pattern IP.

Figure 10:
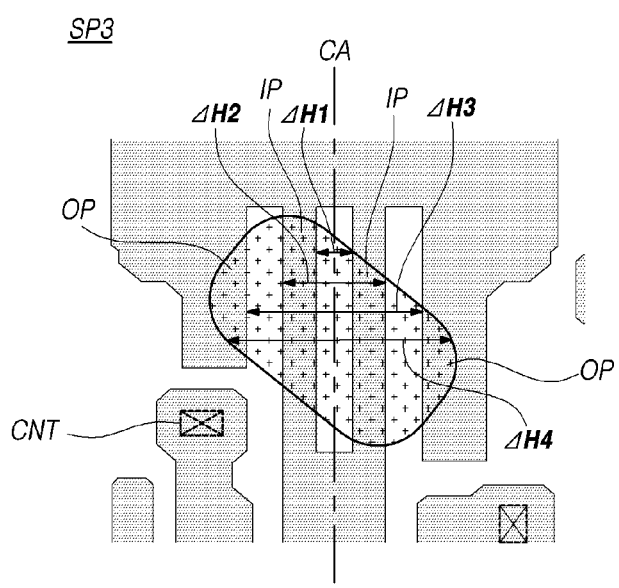
Figure 11:
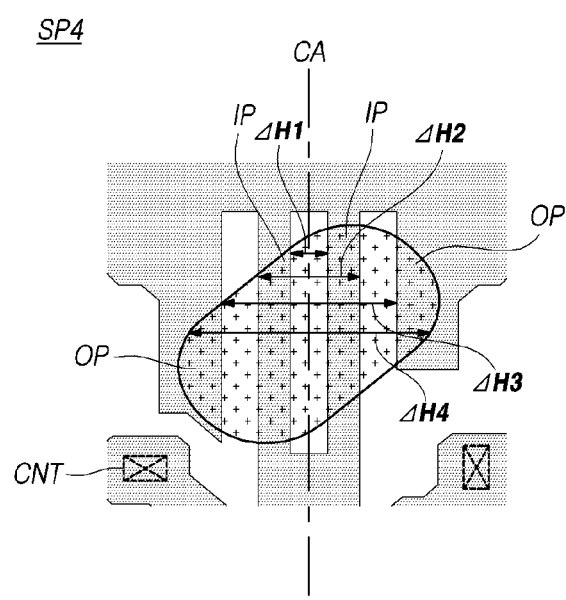

Referring to FIGS. 10 and 11, when the light emitting areas EA of the third sub-pixel SP3 and the fourth sub-pixel SP4 are positioned to overlap the driving voltage line DVL and are not positioned to overlap the data line, the inner pattern IP may constitute a driving voltage line. That is, a high potential driving voltage for driving the sub-pixel may be applied to the inner pattern IP.

Accordingly, the inner pattern IP may be a pattern in which both the inner boundary and the outer boundary overlap the light emitting area EA. In the same sense, the inner pattern IP may be a second source-drain electrode material pattern SD2 penetrating a region below the light emitting area EA.

The inner patterns IP are symmetrically arranged with respect to a virtual boundary line extending in the first direction.

Referring to FIGS. 8 to 11, the inner patterns IP are symmetrically disposed with respect to a central axis CA. The distances from the central axis CA to the inner boundary of the inner pattern IP are the same. In addition, distances from the central axis CA to the outer boundary of the inner pattern IP are the same.

The distance between the inner boundary of the inner pattern IP may be defined as a first distance ΔH1, and the distance between the outer boundary of the inner pattern IP may be defined as a second distance ΔH2. The first distance ΔH1 and the second distance ΔH2 are the same in both the red sub-pixel R and the green sub-pixels G1 and G2. Accordingly, the color vision angle characteristics are all aligned at similar levels in the blue sub-pixel B, the red sub-pixel R, and the green sub-pixels G1 and G2.

Meanwhile, referring to FIGS. 8 to 11, the second source-drain electrode material pattern SD2 may include an outer pattern OP.

Here, the outer pattern OP means a pattern outside the inner pattern IP of the second source-drain electrode material pattern SD2 overlapping the light emitting area EA.

For example, referring to FIGS. 8 and 9, the light emitting area EA of the first sub-pixel SP1 and the second sub-pixel SP2 may overlap the data line that is the inner pattern IP and the driving voltage line DVL. Accordingly, with respect to the first sub-pixel SP1 and the second sub-pixel SP2, the outer pattern OP constitutes a driving voltage line DVL.

Furthermore, referring to FIGS. 10 and 11, the light emitting area EA of the third sub-pixel SP3 and the fourth sub-pixel SP4 may overlap the driving voltage line DVL constituting the inner pattern IP. In addition, the light emitting area EA of the third sub-pixel SP3 and the fourth sub-pixel SP4 may be further disposed to overlap the driving voltage line DVL constituting the outer pattern OP. The inner pattern IP and the outer pattern OP may be the same driving voltage line DVL.

Referring to FIGS. 8 to 11, the outer patterns OP are symmetrically disposed with respect to the central axis CA. The distances from the central axis CA to the inner boundary of the outer pattern OP are the same in the first to fourth sub-pixels SP1 to SP4.

That is, the distance ΔH3 between the inner boundaries of the outer pattern OP is the same in the first to fourth sub-pixels SP1 to SP4.

However, the first to fourth sub-pixels SP1 to SP4 may have different sizes and shapes. Accordingly, the distance ΔH4 between the outer boundaries of the outer pattern OP may be different from each other in the first to fourth sub-pixels SP1 to SP4.

The first sub-pixel SP1 may be a blue sub-pixel B. The second sub-pixel SP2 may be a red sub-pixel R. The third sub-pixel SP3 may be a first green sub-pixel G1. The fourth sub-pixel SP4 may be a second green sub-pixel G2. However, embodiments of the present specification are not limited thereto.

As described above, the distance between the inner patterns IP may be the same for each sub-pixel. Accordingly, the color vision angle deviation due to the second source-drain electrode material pattern SD2 may be reduced.

In addition, the distance between the inner boundaries of the outer patterns OP may be the same for each sub-pixel.

Figure 12:
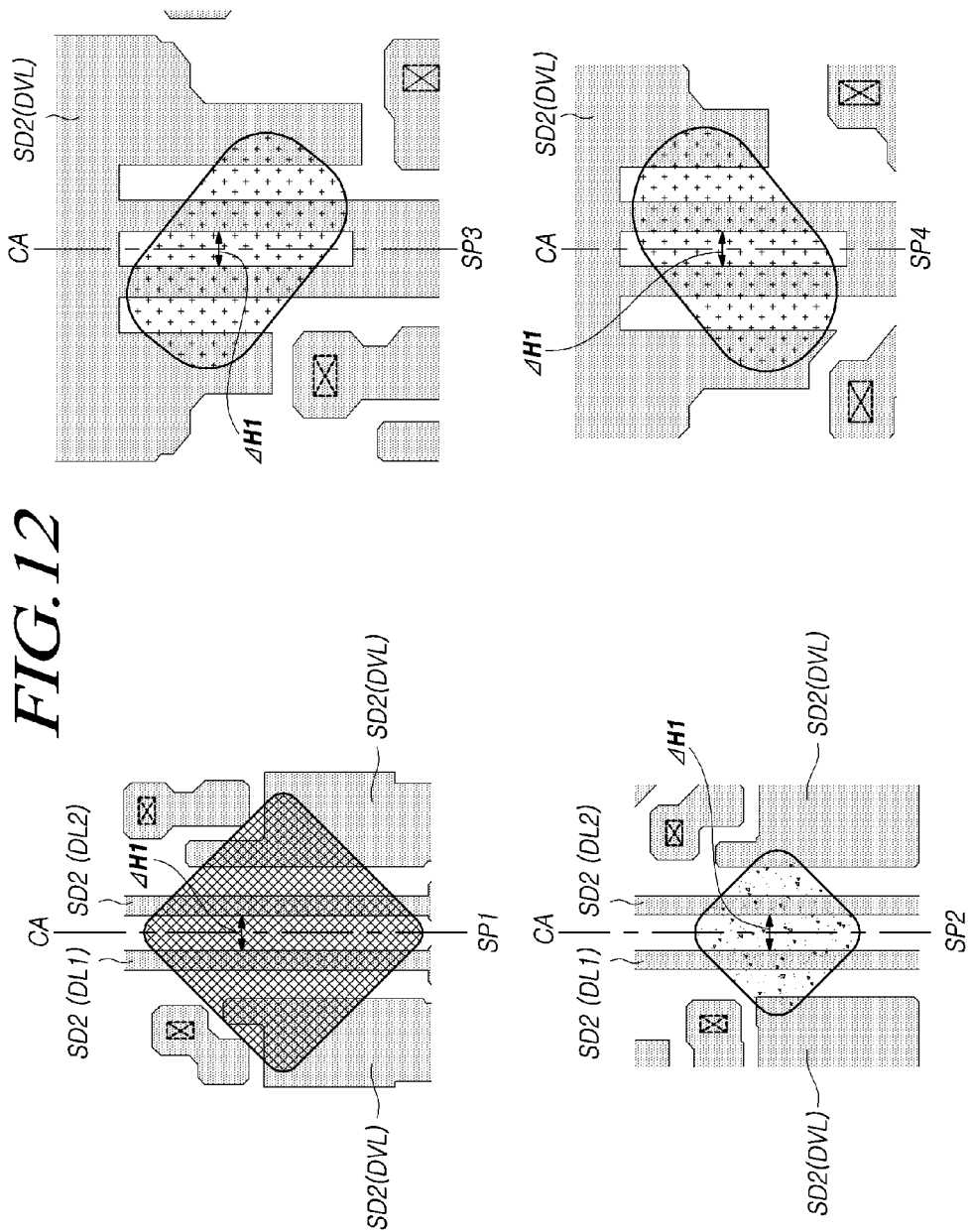
FIG. 12 is a diagram showing that at least a part of a second source-drain electrode material pattern is overlapped with respect to a central axis in a display device according to embodiments of the present disclosure.

Accordingly, the color vision angle deviation due to the first source-drain electrode material pattern SD1 may be minimized FIG. 12 is a diagram showing that at least a part of a second source-drain electrode material pattern SD2 is overlapped with respect to a central axis CA in a display device according to embodiments of the present disclosure.

FIG. 12 schematically illustrates the second source-drain electrode material pattern SD2 and the light emitting region.

Referring to FIG. 12, in the first sub-pixel SP1 and the second sub-pixel SP2, the second source-drain electrode material pattern SD2 are spaced apart from each other by a first distance ΔH1. The first data line DL1 and the second data line DL2 may be symmetrically arranged with respect to the central axis CA, and at least a part thereof may be overlapped with respect to the central axis CA.

In addition, the first sub-pixel SP1 and the second sub-pixel SP2 may be positioned at the same distance as the driving voltage line DVL with respect to the central axis CA. Accordingly, at least a portion of the driving voltage line DVL may be overlapped with respect to the central axis CA.

The central axis CA of the first sub-pixel SP1 may coincide with the central axis of the second sub-pixel SP2.

Referring to FIG. 12, in the third sub-pixel SP3 and the fourth sub-pixel SP4, the second source-drain electrode material pattern SD2 are spaced apart from each other with a first distance ΔH1 in a region where the driving voltage line DVL overlaps the light emitting region EA. At least a part of the driving voltage lines DVL disposed to be spaced apart from each other may be overlapped with respect to the central axis CA.

The central axis CA of the third sub-pixel SP3 and the fourth sub-pixel SP4 may coincide.

In the third sub-pixel SP3 and the fourth sub-pixel SP4, the driving voltage lines DVL may be spaced apart from each other in a region overlapping the light emitting area EA. The driving voltage line DVL may include slits configured to be spaced apart from each other in the light emitting area. The central axis CA of the third sub-pixel SP3 and the fourth sub-pixel SP4 may pass through the center of the slit in the first direction (a direction in which the data line DL and/or the driving voltage line DVL extends).

FIGS. 13A to 13D are diagrams illustrating various embodiments of an inner pattern.

Figure 13A:
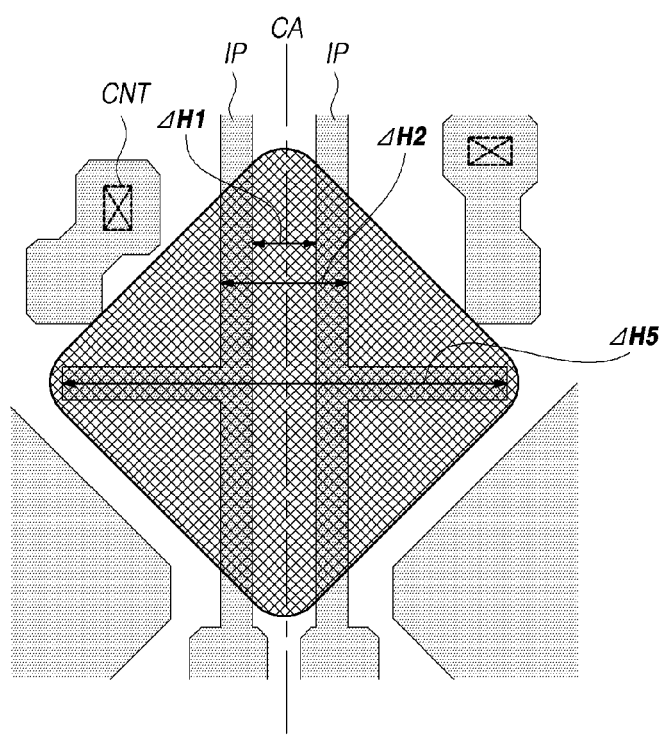
FIGS. 13A to 13D are diagrams illustrating various embodiments of an inner pattern according to embodiments of the present disclosure.

Referring to FIG. 13A, the inner pattern IP may include a branch. For example, when the data line and the driving voltage line are arranged to extend in the first direction, the inner pattern IP may include a branch extended in a second direction different from the first direction in a region overlapping the light emitting area of the sub-pixel. The branch is symmetrically arranged with respect to the central axis CA. The second direction may be, for example, a direction perpendicular to the first direction. The second direction may be, for example, a direction in which a plurality of gate lines extend.

When the inner pattern IP includes a branch, the distance between the outer boundaries of the branch is defined as a fifth distance ΔH5. The fifth distance ΔH5 may vary depending on the sub-pixel, but the branch may be formed to extend to the boundary of the light emitting area.

Accordingly, the inner pattern IP may overlap the light emitting area within the wider area. According to this, even when the outer pattern OP is not disposed, the step due to the first source-drain electrode material pattern SD1 can be partially compensated only with the inner pattern IP.

Figure 13B:
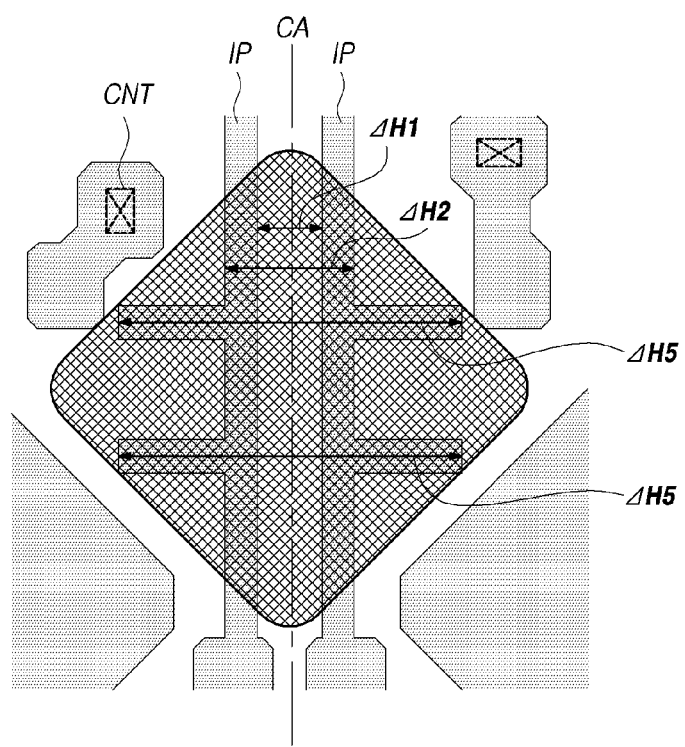

Referring to FIG. 13B, the inner pattern IP according to embodiments of the present specification may include a plurality of branches. Accordingly, the inner pattern IP may overlap the light emitting area within the wider area. According to this, even when the outer pattern OP is not disposed, the step due to the first source-drain electrode material pattern SD1 may be partially compensated only with the inner pattern IP.

The lengths of the plurality of more branches may be the same, but may be different from each other. That is, any one of the plurality of branches may be disposed across the light emitting area while passing through the center of the light emitting area.

The plurality of branches may extend in the same direction or in different directions within the light emitting area.

Figure 13C:
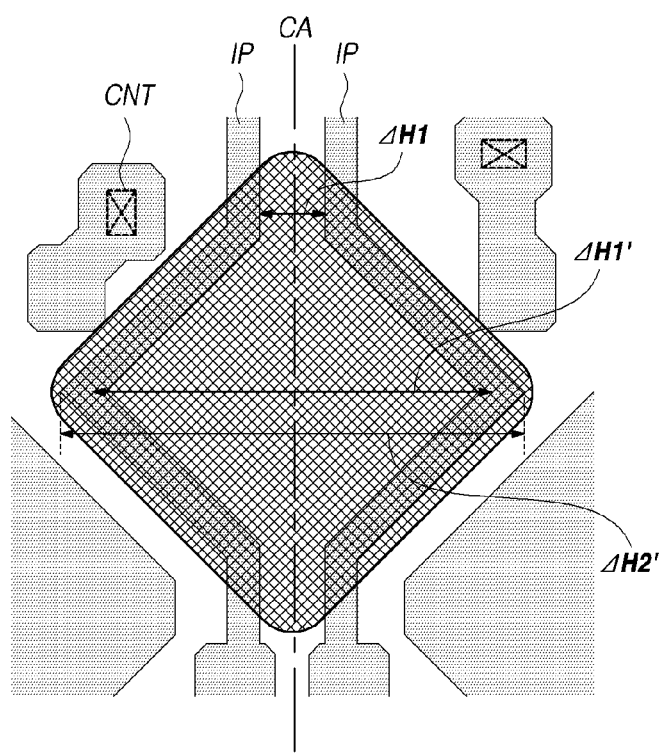
Figure 13D:
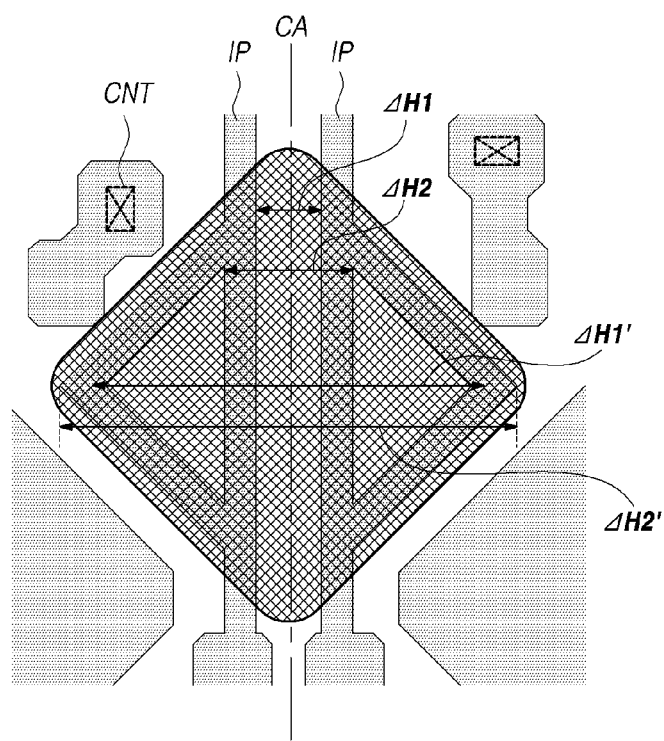

Referring to FIGS. 13C and 13D, the inner pattern IP may be disposed while routing in a region overlapping the light emitting region so as to be disposed at a boundary part of the light emitting region.

When the inner pattern IP is routed in a region overlapping the light emitting area, the maximum distance of the inner boundary in the inner pattern is "modified first distance ΔH1'", and the maximum distance of the outer boundary in the inner pattern is "modified second distance ΔH2'". The minimum distance of the inner boundary in the inner pattern is a first distance ΔH1, and the minimum distance of the outer boundary in the inner pattern is a second distance ΔH2.

Accordingly, even when the outer pattern OP is not disposed, a step of the second planarization layer PLN2 by the first source-drain electrode material pattern SD1 may be partially compensated only by the inner pattern IP.

The embodiments of the present specification described above will be briefly described below.

According to aspects of the present specification, there may be a display device 100 including a substrate SUB, a transistor (e.g., DRT) disposed on the substrate SUB and including a first source-drain electrode material pattern SD1, an active layer ACT, and a gate electrode GATE positioned to overlap the active layer ACT, a first planarization layer PLN1 disposed on the first source-drain electrode material pattern SD1 of the transistor, a metal pattern (e.g., SD2) disposed on the first planarization layer PLN1 and electrically connected to the transistor, a second planarization layer PLN2 covering the metal pattern SD2 and a bank BANK disposed on the second planarization layer PLN2 and including two or more openings of different sizes, wherein the metal pattern SD2 is spaced apart at the same interval in regions under the two or more openings of different sizes.

According to aspects of the present specification, there may be a display device 100, wherein the metal pattern SD2 includes an inner pattern IP, wherein the inner pattern IP includes an inner boundary close to the center of the openings and an outer boundary far from the center of the openings, wherein the inner boundary of the inner pattern IP and the outer boundary of the inner pattern IP overlap at least one opening.

According to aspects of the present specification, there may be a display device 100, wherein an interval ΔH1 between inner boundaries of the inner pattern IP is the same in the region under the openings.

According to aspects of the present specification, there may be a display device 100, wherein an interval ΔH2 between outer boundaries of the inner pattern IP is the same in the region under the openings.

According to aspects of the present specification, there may be a display device 100, wherein the metal pattern SD2 extends in the first direction from the region below the openings, wherein the inner pattern IP includes a branch formed by extending an outer boundary of the inner pattern IP in a second direction different from the first direction.

According to aspects of the present specification, there may be a display device 100, wherein the metal pattern SD2 positioned to overlap any one of the two or more openings having different sizes constitutes a data line DL to which a data voltage Vdata for displaying an image is applied, wherein the metal pattern SD2 positioned to overlap another opening of the two or more openings having different sizes constitutes a driving voltage line DVL for transmitting a high potential driving voltage ELVDD supplied to the first source-drain electrode material pattern SD1.

According to aspects of the present specification, there may be a display device 100, wherein any opening of the two or more openings of different sizes is the opening of the first color sub-pixel (e.g., blue sub-pixel B), wherein another opening of the two or more openings of different sizes is the opening of a second color sub-pixel (e.g., green sub-pixels G1 and G2) different from the first color, wherein the opening of the first color sub-pixel is positioned to overlap two different data lines DL1 and DL2, and wherein the opening of the second color sub-pixel is positioned to overlap the driving voltage line DVL.

According to aspects of the present specification, there may be a display device 100, wherein the driving voltage line DVL includes a slit, and at least a part of the slit is positioned to overlap the opening of the second color sub-pixel.

According to aspects of the present specification, there may be a display device 100, wherein the slit is positioned to overlap the center of the opening of the second color sub-pixel.

According to aspects of the present specification, there may be a display device 100, wherein the opening of the first color sub-pixel is positioned to overlap at least a portion of the driving voltage line DVL.

According to aspects of the present specification, there may be a display device 100, wherein the metal pattern SD2 positioned to overlap the opening of the second color sub-pixel includes an inner pattern IP with a width equal to the width of the data lines DL1 and DL2 positioned to overlap the opening of the first color sub-pixel.

According to aspects of the present specification, there may be a display device 100, wherein the metal pattern SD2 includes an outer pattern OP positioned to overlap the opening of the second color sub-pixel outside the inner pattern IP.

According to aspects of the present specification, there may be a display device 100, wherein the outer pattern OP constitutes the driving voltage line DVL.

According to aspects of the present specification, there may be a display device 100, wherein the metal pattern SD2 is a second source-drain electrode material pattern SD2, wherein the second source-drain electrode material pattern SD2 is the same material as the first source-drain electrode material pattern SD1.

According to aspects of the present specification, there may be a display device 100, wherein the second planarization layer PLN2 includes a step corresponding to the metal pattern SD2 in a region overlapping the openings.

According to aspects of the present specification, there may be a display device 100, wherein the display device 100 further includes a light emitting device ED including a first electrode (e.g., anode electrode AE) connected to the metal pattern SD2 through a contact hole CNT, a light emitting layer EL, and a second electrode (e.g., cathode electrode CE) that is a common electrode, and wherein the contact hole CNT is located outside the openings.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A display device comprising:
   a substrate;
   a transistor on the substrate, the transistor including a first source-drain electrode material pattern, an active layer, and a gate electrode that overlaps the active layer;
   a first planarization layer on the first source-drain electrode material pattern of the transistor;
   a two or more metal patterns on the first planarization layer, the two or more metal patterns electrically connected to the transistor;
   a second planarization layer on the two or more metal patterns; and
   a bank on the second planarization layer, the bank including a plurality of openings of different sizes,
   wherein the two or more metal patterns are spaced apart at a same interval in regions under the plurality of openings of different sizes.

2. The display device of claim 1, wherein the two or more metal patterns include an inner pattern that includes an inner boundary and an outer boundary, the inner boundary closer to a center of the plurality of openings than the outer boundary,
   wherein the inner boundary of the inner pattern and the outer boundary of the inner pattern overlap at least one opening from the plurality of openings.

3. The display device of claim 2, wherein an interval between inner boundaries of the inner pattern is a same in the regions under the plurality of openings.

4. The display device of claim 2, wherein an interval between outer boundaries of the inner pattern is a same in the regions under the plurality of openings.

5. The display device of claim 2, wherein the two or more metal patterns extend in a first direction from the regions below the plurality of openings,
   wherein the inner pattern includes a branch that extends from the outer boundary of the inner pattern in a second direction that is different from the first direction.

6. The display device of claim 2, wherein the two or more metal patterns include an outer pattern that is outside the inner pattern in regions under the plurality of openings of different sizes,
   wherein the outer pattern includes an inner boundary and an outer boundary, the inner boundary closer to a center of the plurality of openings than the outer boundary, and
   wherein an interval between inner boundaries of the outer pattern is a same in the regions under the plurality of openings.

7. The display device of claim 1, wherein the two or more metal patterns overlap any one of the plurality of openings having different sizes and constitutes a data line to which a data voltage for displaying an image is applied,
   wherein the two or more metal patterns overlap another opening of the plurality of openings having different sizes and constitutes a driving voltage line for transmitting a high potential driving voltage supplied to the first source-drain electrode material pattern.

8. The display device of claim 7, wherein any opening of the plurality of openings of different sizes is an opening of a first color sub-pixel,
   wherein another opening of the plurality of openings of different sizes is an opening of a second color sub-pixel that is different from the first color sub-pixel,
   wherein the opening of the first color sub-pixel overlaps two different data lines, and
   wherein the opening of the second color sub-pixel overlaps the driving voltage line.

9. The display device of claim 8, wherein the driving voltage line includes a slit, and at least a part of the slit overlaps the opening of the second color sub-pixel.

10. The display device of claim 9, wherein the slit overlaps a center of the opening of the second color sub-pixel.

11. The display device of claim 8, wherein the opening of the first color sub-pixel overlaps at least a portion of the driving voltage line.

12. The display device of claim 8, wherein the two or more metal patterns that overlap the opening of the second color sub-pixel includes an inner pattern with a width that is equal to a width of the data lines that overlaps the opening of the first color sub-pixel.

13. The display device of claim 12, wherein the two or more metal patterns include an outer pattern that overlaps the opening of the second color sub-pixel outside the inner pattern.

14. The display device of claim 13, wherein the outer pattern constitutes the driving voltage line.

15. The display device of claim 1, wherein the two or more metal patterns are a second source-drain electrode material pattern, the second source-drain electrode material pattern including a same material as the first source-drain electrode material pattern.

16. The display device of claim 1, wherein the second planarization layer includes a step corresponding to the two or more metal patterns in a region overlapping the plurality of openings.

17. The display device of claim 1, wherein the display device further comprises:
   a light emitting device including a first electrode connected to the two or more metal patterns through a contact hole, a light emitting layer, and a second electrode that is a common electrode, and
   wherein the contact hole is located outside the plurality of openings.

18. A display device comprising:
   a substrate;

a transistor on the substrate, the transistor including a first source-drain electrode material pattern, an active layer, and a gate electrode that overlaps the active layer;

a first planarization layer on the first source-drain electrode material pattern of the transistor;

a two or more metal patterns on the first planarization layer, the two or more metal patterns electrically connected to the transistor;

a second planarization layer on the two or more metal patterns; and a bank disposed on the second planarization layer, the bank including a plurality of openings of different sizes, wherein the two or more metal patterns are symmetrically disposed in regions under the plurality of openings of different sizes.

19. The display device of claim 18, wherein the two or more metal patterns are symmetrically disposed with respect to a central axis extending in a first direction in regions under the plurality of openings of different sizes, and the first direction is a direction in which a data line extends.

20. The display device of claim 19, wherein the two or more metal patterns include an inner pattern constituting a data line or a driving voltage line, and an outer pattern outside the inner pattern in regions under the plurality of openings of different sizes, and wherein the inner pattern is symmetrically disposed with respect to the central axis, and the outer pattern is symmetrically disposed with respect to the central axis.

* * * * *